(12) United States Patent
Udagawa

(10) Patent No.: US 6,797,990 B2
(45) Date of Patent: Sep. 28, 2004

(54) BORON PHOSPHIDE-BASED SEMICONDUCTOR DEVICE AND PRODUCTION METHOD THEREOF

(75) Inventor: Takashi Udagawa, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 40 days.

(21) Appl. No.: 10/180,059

(22) Filed: Jun. 27, 2002

(65) Prior Publication Data
US 2003/0001162 A1 Jan. 2, 2003

Related U.S. Application Data
(60) Provisional application No. 60/308,584, filed on Jul. 31, 2001.

(30) Foreign Application Priority Data
Jun. 29, 2001 (JP) .................................. P2001-197788

(51) Int. Cl.[7] ........................ H01L 33/00; H01L 21/00
(52) U.S. Cl. ................. 257/102; 257/103; 438/46; 438/47
(58) Field of Search ............................ 257/102, 103; 438/46, 47

(56) References Cited

U.S. PATENT DOCUMENTS 5,042,043 A 8/1991 Hatano et al.
6,194,744 B1 * 2/2001 Udagawa et al. ............ 257/94

FOREIGN PATENT DOCUMENTS

JP 10-242569 9/1998
JP 02002084001 A * 4/2002 ................ 257/103

* cited by examiner

Primary Examiner—Jerome Jackson
(74) Attorney, Agent, or Firm—Sughrue Mion, PLLC

(57) ABSTRACT

A boron phosphide-based semiconductor device including a substrate having thereon an oxygen-containing boron phosphide-based semiconductor layer having boron and phosphorus as constituent elements and oxygen, and a production process therefor.

21 Claims, 3 Drawing Sheets

BORON PHOSPHIDE-BASED SEMICONDUCTOR DEVICE AND PRODUCTION METHOD THEREOF

CROSS REFRENCE TO RELATED APPLICATIONS

This application claims benefit of Provisional Application No. 60/308,584 filed Jul. 31, 2001, incorporated herein by reference.

FIELD OF THE INVENTION

The present invention relates to a technique of constructing a boron phosphide-based semiconductor device utilizing a high-resistance boron phosphide (BP)-based semiconductor which is effective in evading unnecessary leakage or passing of a device operating current.

BACKGROUND OF THE INVENTION

As the Group III-V compound semiconductor comprising boron (B) belonging to Group III of the Periodic Table and an element belonging to Group V, boron phosphide (BP) is known (see, Nature, 179, No. 4569, page 1075 (1957)). For the boron phosphide, various band gaps have been heretofore reported. For example, B. Stone et al. report a room temperature band gap of about 6 electron volt (eV) for polycrystalline BP film (see, Phys. Rev. Left., Vol. 4, No. 6, pages 282 to 284 (1960)). Furthermore, Manca reports a band gap of 4.2 eV (see, J. Phys. Chem. Solids, 20, page 268 (1961)). However, a value of about 2 eV has been heretofore commonly employed as the band gap of boron phosphide (see, (1) RCA Review, 25, pages 159 to 167 (1964), (2) Z. anorg. allg. chem., 349, pages 151 to 157 (1967), (3) Iwao Teramoto, Handotai Device Gairon (Outline of Semiconductor Device), 1st ed., page 28, Baifukan (Mar. 30, 1995)).

On the other hand, boron phosphide has a small ionic bonding degree according to Philips of 0.006 (see, Philips, Handotai Ketsugoron (Semiconductor Bonding Theory), 3rd imp., pages 49 to 51, Yoshioka Shoten (Jul. 25, 1985)) and therefore, is characterized in that a conductive semiconductor layer is readily obtained (see, JP-A-2-288388 (the term "JP-A" as used herein means an "unexamined published Japanese patent application")). Because of this, a case of using an electrically conducting BP layer as a current narrowing layer constituting a Group III nitride semiconductor laser diode (LD) is heretofore known (see, JP-A-10-242569). In a light-emitting diode (LED), the BP layer is used, for example, as a buffer layer on a single crystal substrate (see, JP-A-2-275682). On the other hand, effective electron mass of electron boron phoshipde is relatively large (see, JP-A-10-242569, supra) and therefore, it is considered that an n-type low-resistance BP crystal cannot be so readily obtained (see, JP-A-2-288388, supra).

When reviewed from the aspect of crystallographic property, boron phosphide of cubic spharelite type (see, Philips, Handotai Ketsugoron (Semiconductor Bonding Theory), 3rd imp., pages 14 and 15, Yoshioka Shoten (Jul. 25, 1985)) has a lattice constant of 4.538 Å which is almost the same as that of cubic gallium nitride (c-GaN: lattice constant=4.510 Å). The distance between {110} lattice planes of BP is about 3.209 Å and this is almost equal to the a-axis lattice constant of hexagonal GaN (h-GaN), namely, 3.180 Å (see, Handotai Device Gairon (Outline of Semiconductor Device), page 28, supra). By making use of this good lattice matching, a Schottky junction field effect transistor (MESFET) has been heretofore constructed by utilizing a junction structure of a BP buffer layer and a GaN crystal layer (see, JP-A-2000-31164).

The boron phosphide (BP) is an indirect transition-type semiconductor (see, Handotai Device Gairon (Outline of Semiconductor Device), page 28, supra). In the indirect transition-type semiconductor, the radiation recombination efficiency of a carrier in emitting light is low as compared with a direct transition-type semiconductor (see, K. Seeger, Semiconductor no Butsuri Gaku (Ge) (Physics of Semiconductor (Last Volume))", 1st imp., page 392, Yoshioka Shoten (Jun. 25, 1991)). Because of this, boron phosphide, which is an indirect transition-type semiconductor, is used, for example, as a current narrowing layer as described above but not as a light-emitting layer (active layer) of an LED or LD. In a field effect-type transistor, use of BP as a buffer layer has been proposed.

For example, in the case of a buffer layer for use in a field effect transistor, the buffer layer must be constituted by a high-resistance crystal layer so as to prevent the leakage of drain current. However, the band gap at room temperature of conventional boron phosphide is as low as about 2 eV (see, (1) RCA Review and (2) Z. anorg. allg. chem.) and moreover, the crystal has a low ionic bonding property and is readily made conductive. Therefore, conventional techniques have a problem in that a high-resistance buffer layer suitable for use in MESFET cannot be readily obtained.

Also, a technique of manufacturing a super lattice structure of boron phosphide having a band gap of 2 eV with an aluminum nitride (AlN)-based mixed crystal to obtain a structure having a band gap of 2 eV or more at room temperature has heretofore been disclosed (see, JP-A-2-275682, supra). However, this conventional technique has a problem in that cumbersome means is necessary for forming the super lattice structure.

SUMMARY OF THE INVENTION

The present invention has been made to overcome the above-described problems in conventional techniques. Therefore, an object of the present invention is to form a high-resistance boron phosphide-based semiconductor layer without requiring any cumbersome means as in conventional techniques and to provide a boron phosphide-based semiconductor device constructed by using this high-resistance boron phosphide-based semiconductor layer. The object of the present invention includes providing a production method of the boron phosphide-based semiconductor device.

DETAILED DESCRIPTION OF THE INVENTION

Figure 1:
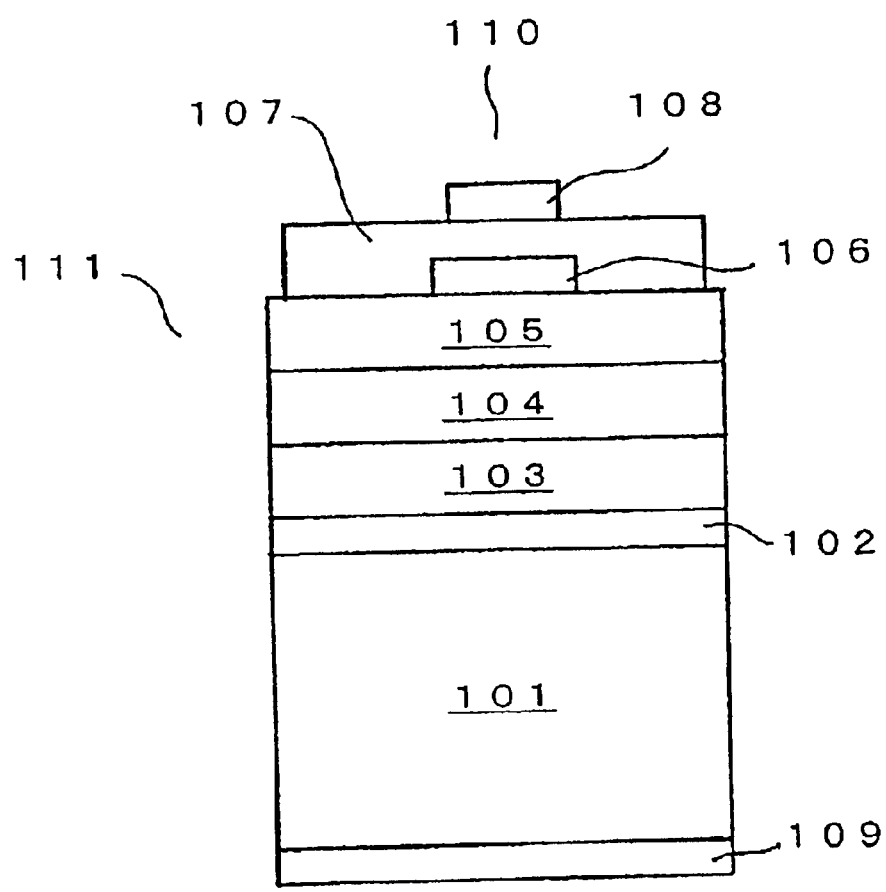
FIG. 1 is a schematic sectional view of an LED according to Example 1 of the present invention.

More specifically, the present invention provides a boron phosphide-based semiconductor device having an oxygen-containing boron phosphide-based semiconductor layer, described in (1) to (4) below.

(1) A boron phosphide-based semiconductor device comprising a substrate having stacked thereon an oxygen-containing boron phosphide-based semiconductor layer containing boron (B) and phosphorus (P) as constituent elements and further containing oxygen (O).

(2) The boron phosphide-based semiconductor device as described in (1) above, wherein the concentration of oxygen atom contained in the oxygen-containing boron phosphide-based semiconductor layer is from $1 \times 10^{18}$ to less than $5 \times 10^{20}$ cm$^{-3}$.

(3) The boron phosphide-based semiconductor device as described in (1) or (2) above, wherein the resistivity of the oxygen-containing boron phosphide-based semiconductor layer is $10^2$ Ω·cm or more.

(4) The boron phosphide-based semiconductor device as described in any one of (1) to (3) above, wherein the oxygen-containing boron phosphide-based semiconductor layer is provided on an amorphous or polycrystalline boron phosphide-based semiconductor layer.

Of the boron phosphide-based semiconductor devices having an oxygen-containing boron phosphide-based semiconductor layer, described in (1) to (4) above, the present invention particularly provides the following transistor or light-emitting device. Furthermore, the present invention provides a lamp or a light source using the light-emitting device.

(5) A transistor having the oxygen-containing boron phosphide-based semiconductor layer described in any one of (1) to (4) above.

(6) The transistor as described in (5) above, which has a buffer layer comprising the oxygen-containing boron phosphide-based semiconductor layer.

(7) The transistor as described in (5) or (6) above, which is a field effect transistor having a channel layer provided on the oxygen-containing boron phosphide-based semiconductor layer.

(8) The transistor as described in any one of (5) to (7) above, which is a field effect transistor having a Schottky gate electrode disposed on the oxygen-containing boron phosphide-based semiconductor layer.

(9) A light-emitting device having a current blocking layer comprising the oxygen-containing boron phosphide-based semiconductor layer described in any one of (1) to (4) above.

(10) The light-emitting device as described in (9) above, which is a light-emitting diode (LED) obtained by providing an electrode on the current blocking layer comprising the oxygen-containing boron phosphide-based semiconductor layer.

(11) A lamp using the light-emitting device described in (10) above.

(12) A light source using the lamp described in (11) above.

(13) The light-emitting device as described in (9) above, which is a laser diode (LD) obtained by providing an electrode on a central open part of the device opposite the current blocking layer comprising the oxygen-containing boron phosphide-based semiconductor layer.

The present invention also provides a method for producing a boron phosphide-based semiconductor device, described in (14) to (17) below.

(14) A method for producing the boron phosphide-based semiconductor device described in any one of (1) to (4) above, which comprises stacking a boron phosphide-based semiconductor layer on a substrate by a metal organic chemical vapor deposition method (MOCVD) and adding oxygen to the boron phosphide-based semiconductor layer using an oxygen-containing compound as a starting material to form an oxygen-containing boron phosphide-based semiconductor layer.

(15) The production method of the boron phosphide-based semiconductor device as described in (14) above, wherein the oxygen-containing compound is an organic compound having added thereto an alkoxyl group (—OR, wherein R represents a linear or branched, saturated or unsaturated alkyl group having from 1 to 12 carbon atoms), or a group bonded to oxygen, such as an aromatic or alicyclic group having from 6 to 20 carbon atoms; examples of the fundamental skeleton of the aromatic group include a benzene ring, a naphthalene ring, an anthracene ring and a phenanthrene ring; the aromatic group may be freely substituted by CN, a halogen atom, OH, a carbonyl group, a carboxyl group, etc.; and examples of the fundamental skeleton of the alicyclic group include a cyclohexyl ring).

(16) A method for producing the boron phosphide-based semiconductor device as described in (14) or (15) above, wherein the oxygen-containing compound is a trialkoxyborane compound.

(17) A method for producing the boron phosphide-based semiconductor device described in (4) above, which comprises forming on a substrate a boron phosphide-based semiconductor layer with the major part (more than 50 wt %) being amorphous or polycrystalline at a temperature of 250 to 700° C., and then forming an oxygen-containing boron phosphide-based semiconductor layer at a temperature of over 700 to 1,200° C.

In the present invention, a Group 111-V compound semiconductor containing boron (B) and phosphorus (P) as constituent elements, represented, for example, by the formula: $B_\alpha Al_\beta Ga_\gamma In_{1-\alpha-\beta-\gamma}P_{1-\delta}As_\delta$ (wherein $0<\alpha\leq 1, 0\leq\beta<1, 0\leq\gamma<1, 0<\alpha+\beta+\gamma\leq 1$ and $0\leq\delta<1$), is referred to as a boron phosphide-based semiconductor. Furthermore, a Group III-V compound semiconductor represented, for example, by the formula: $B_\alpha Al_\beta Ga_\gamma In_{1-\alpha-\beta-\gamma}P_{1-\delta}N_\delta$ (wherein $0<\alpha\leq 1, 0\leq\beta<0\leq 1, 0\delta<1, <\alpha+\beta=\leq 1$ and $0 \leq\delta<1$) is also referred to as a boron phosphide-based semiconductor. In the first embodiment of the present invention, a boron phosphide-based semiconductor device is constructed using an oxygen-containing boron phosphide-based semiconductor layer stacked on a substrate, where the oxygen-containing boron phosphide-based semiconductor layer contains boron (B) and phosphorus (P) as constituent elements and further contains oxygen. For example, a boron phosphide-based semiconductor device is constructed using an oxygen-containing boron aluminum phosphide mixed crystal ($B_\alpha Al_\beta P$: $0<\alpha\leq 1$, $\alpha+\beta=1$). Or, a boron phosphide-based semiconductor device is constructed using an oxygen-containing boron gallium phosphide mixed crystal ($B_\alpha Ga_\gamma P$: $0<\alpha\leq 1$, $\alpha+\gamma=1$) or an oxygen-containing boron indium phosphide mixed crystal ($B_\alpha In_{1-\alpha}P$: $0<\alpha\leq 1$). Or, a boron phosphide-based semiconductor device is constructed using an oxygen-containing boron phosphide-based semiconductor comprising, as constituent elements, a plurality of Group V elements, such as oxygen-containing boron nitride phosphide ($BP_{1-X}N_X$: $0<X<1$). A binary crystal can be more readily formed than the ternary or quaternary semiconductor mixed crystal comprising three or four constituent elements (see, *Handotai Device Gairon* (*Outline of Semiconductor Device*, page 24, supra). Therefore, a boron phosphide-based semiconductor layer according to the first embodiment is preferably composed, for example, of a monomer boron phosphide (BP: boron monophosphide).

In the case where the boron phosphide-based semiconductor layer in an undoped state contains an oxygen atom as a residual impurity in a concentration described in the embodiment of the present invention according to (2) above, oxygen need not be doped in the boron phosphide-based semiconductor layer so as to form an oxygen-containing boron phosphide-based semiconductor layer. On the other hand, in the case where the concentration of oxygen atom as a residual impurity is less than $1\times10^{18}$ cm$^{-3}$, an oxygen-containing boron phosphide-based semiconductor layer having an oxygen atom concentration of $1\times10^{18}$ cm$^{-3}$ or more must be formed by intentionally adding (doping with) oxygen at the time of stacking the boron phosphide-based semiconductor layer, so as to manufacture the boron phosphide-based semiconductor device of the present invention. In the second embodiment of the present invention, an oxygen-containing boron phosphide-based semiconductor layer having an oxygen atom concentration of $1\times10^{18}$ cm$^{-3}$ or more is formed by vapor phase growth means such as metal organic chemical vapor deposition (MOCVD) method (see, *Inst. Phys. Conf. Ser.*, No. 129, IOP Publishing Ltd., pages 157 to 162 (1993)), molecular beam epitaxy (MBE) method (see, *J. Solid State Chem.*, 133, pages 269 to 272 (1997)), halide method (see, (1) *Nippon Kessho Seicho Gakkaishi* (*journal of the Japanese association for crystal growth society*), Vol. 24, No. 2, page 150 (1997), (2) *J. Appl. Phys.*, 42(1), pages 420 to 424 (1971)) or hydride method, while doping with oxygen, if desired, depending on the concentration of residual oxygen. In order to maintain good crystallinity of the semiconductor layer, the oxygen atom concentration in the oxygen-containing boron phosphide-based semiconductor layer is preferably less than about $5\times10^{20}$ cm$^{-3}$. The oxygen atom concentration in the boron phosphide-based semiconductor layer can be determined, for example, by general analysis means such as secondary ion mass spectrometry (SIMS).

The oxygen-containing boron phosphide-based semiconductor layer having a resistivity of $10^2$ Ω·cm or more according to the present invention can be effectively used as a high-resistance layer capable of preventing the leakage of a device operating current in the construction of a semiconductor device. The resistivity varies depending on the concentration of oxygen atom contained inside the boron phosphide-based semiconductor layer. As the concentration of the oxygen atom is higher, the resistivity thus obtained tends to be a higher value. This is because oxygen in the semiconductor layer electrically compensates an electron or a hole. Accordingly, in the third embodiment of the present invention, a boron phosphide-based semiconductor device is manufactured using a boron phosphide-based semiconductor layer rendered to have a resistivity of $10^2$ Ω·cm or more by appropriately adjusting the amount of doped oxygen. The resistivity (=specific resistance) can be measured, for example, by general Hall effect measuring means.

The oxygen-containing boron phosphide-based semiconductor layer having an oxygen atom concentration of $1\times10^{18}$ cm$^{-3}$ or more can be obtained, for example, by performing the oxygen doping using an ordinary pressure (almost atmospheric pressure) or reduced pressure MOCVD method having a triethylborane $(C_2H_5)_3B$)/borane (BH$_3$)/phosphine (PH$_3$) reaction system, a triethylborane/diborane $(B_2H_6)$/phosphine reaction system, or a reaction system of triethylborane and an organic phosphorus compound such as tert-butyl phosphine. Examples of the starting material for the oxygen doping include an oxygen gas ($O_2$). For example, when hydrogen gas containing about 50 vol. ppm (volume parts per million) of oxygen is added at a flow rate of 20 cc/min when growing a boron phosphide-based semiconductor layer by the MOCVD method having a reaction system of $(C_2H_5)_3B/PH_3/H_2$, a high-resistance boron phosphide (BP) single crystal layer having a resistivity of about $5\times10^3$ Ω·cm or more can be obtained at 800° C. In order to obtain an oxygen-containing boron phosphide-based semiconductor single crystal layer, the deposit is preferably performed at a high temperature exceeding 700° C. However, if a boron phosphide-based semiconductor layer is deposited at a high temperature exceeding 1,200° C., conversion from the monomer BP into a multimer such as $B_{13}P_2$ takes place outstandingly inside the boron phosphide crystal layer (see, *J. Amer. Ceramic Soc.*, 47, pages 44 to 46 (1964)). As a result, a uniform boron phosphide layer can be hardly obtained and this is not preferred.

Other examples of the starting material suitable for the addition of oxygen to obtain an oxygen-containing boron phosphide-based semiconductor layer include an organic boron compound having added thereto a function group containing oxygen. In particular, an organic compound having added thereto an alkoxyl group (—OR, wherein R represents a linear or branched, saturated or unsaturated alkyl group having from 1 to 12 carbon atoms), or a group bonded to oxygen, such as an aromatic or alicyclic group having from 6 to 20 carbon atoms (examples of the fundamental skeleton of the aromatic group include a benzene ring, a naphthalene ring, an anthracene ring and a phenanthrene ring; the aromatic group may be freely substituted by CN, a halogen atom, OH, a carbonyl group, a carboxyl group, etc.; and examples of the fundamental skeleton of the alicyclic group include a cyclohexyl ring) can be suitably used as a starting material for the addition of oxygen. For example, when an alkoxyl compound of an element constituting the boron phosphide-based semiconductor layer is used as a starting material for the addition of oxygen, an oxygen-containing boron phosphide-based semiconductor layer can be readily and simply formed at the time of stacking of the boron phosphide-based semiconductor layer. Examples of the alkoxyl compound of the constituent element include trimethoxyborane (B(OCH$_3$)$_3$, melting point: about −29° C., boiling point: about +69° C.), triethoxyborane (B(OC$_2$H$_5$)$_3$, melting point: about −85° C., boiling point: about +117° C.) and triisopropoxyborane (B(i-OC$_3$H$_7$)$_3$, boiling point: about +140° C.). The boron alkoxyl compound containing a lower alkyl group has a low melting point and a boiling point exceeding room temperature and therefore, and is suitable as a liquid starting material which can be readily added to the reaction system by general bubbling means. Examples of the alkoxyl compound of phosphorus (P) as a constituent element of the oxygen-containing boron phosphide-based semiconductor layer include methyl phosphate (PO(OCH$_3$)$_3$), trimethyl phosphite (P(OCH$_3$)$_3$), triethyl phosphate (PO(OC$_2$H$_5$)$_3$) and triethyl phosphite (P(OC$_2$H$_5$)$_3$). These phosphorus alkoxyl compounds are also a liquid at room temperature and can be added to the reaction system by bubbling means. Examples of the alkoxyl compound of arsenic (As) include triethoxy arsenic (As(OC$_2$H$_5$)$_3$, boiling point: about +165° C.). Among the alkoxyl compounds of the constituent element of the boron phosphide-based semiconductor, the boron alkoxyl compound is particularly preferred as a starting material for the addition of oxygen because this compound has little toxicity as compared with other phosphorus or arsenic compounds.

The oxygen-containing boron phosphide-based semiconductor according to the present invention is provided on the surface of a crystal substrate comprising, for example, silicon single crystal (silicon), a Group II-V compound semiconductor single crystal such as gallium arsenide (GaAs), gallium phosphide (GaP) or gallium nitride (GaN), an oxide single crystal such as sapphire (α—Al$_2$O$_3$ single crystal) or zinc oxide (ZnO), or a metal such as molybdenum (Mo). A boron phosphide (BP) single crystal can also be used as a substrate (see, *J. Electrochem. Soc.*, 120, pages 802 to 806 (1973)). However, a substrate material other than BP is generally in a lattice mismatching relation with a BP-based semiconductor layer and therefore, a boron phosphide-based semiconductor layer having excellent crystallinity cannot be stably obtained due to the propagation of crystal defects such as dislocations ascribable to the lattice misfit. Therefore, in the fourth embodiment of the present invention, a boron phosphide-based semiconductor layer capable of relaxing the lattice mismatching is disposed as a buffer layer on the crystal substrate to serve as an underlying layer of the oxygen-containing boron phosphide-based semiconductor layer.

When the boron phosphide-based semiconductor layer as a buffer layer is not composed of a single crystal but composed of a material which is amorphous or polycrystalline in the as-grown state, more effective relaxing of the lattice mismatching can be obtained. The buffer layer (boron phosphide-based buffer layer) comprising a boron phosphide-based semiconductor which is amorphous or polycrystalline in the as-grown state can be formed by setting the deposition temperature from 250 to 700° C. during the above-described vapor phase growth means. As the deposition temperature is lowered, a boron phosphide-based buffer layer with the major part thereof being amorphous can be more readily obtained. However, if the deposition temperature is 250° C. or less, the decomposition of raw materials for deposition does not proceed satisfactorily and therefore, the deposition is disadvantageously unstable, whereas if it exceeds about 450° C., a boron phosphide-based buffer layer with the major part thereof being polycrystalline is readily formed. If the temperature exceeds 700° C., a single crystal layer which cannot exert a satisfactory effect of relaxing the lattice mismatch is readily formed and this is not preferred. The layer thickness of the boron phosphide-based buffer layer for relaxing the lattice mismatch is suitably from about 2 nm to about 50 nm. When a boron phosphide-based buffer layer having a suitable layer thickness is disposed between the substrate and the oxygen-containing boron phosphide-based layer, the removal of the oxygen-containing boron phosphide-based layer from the substrate surface, which is caused, for example, due to difference in the thermal expansion coefficient between those two materials is effectively avoided. Whether the buffer layer is an amorphous layer or a polycrystalline layer can be analyzed by the general X-ray diffraction method or electron beam diffraction method.

The boron phosphide-based buffer layer can be composed of an undoped layer where impurities are not intentionally added. In stacking the boron phosphide-based buffer layer, when an n-type or p-type impurity is added, an electrically conducting buffer layer can be obtained. For example, when zinc (Zn) or magnesium (Mg) belonging to Group II is added, a p-type boron phosphide-based buffer layer can be obtained. When a Group IV element such as silicon (Si) or tin (Sn) is added, an n-type boron phosphide-based buffer layer can be obtained. Also, when sulfur (S) or selenium (Se) is added, an n-type boron phosphide-based buffer layer can be obtained. The ion of such an element can be added by injection according to the ion implantation method. Whichever means of doping or ion implantation is used, if an impurity element is added in excess, the crystallinity of the boron phosphide-based buffer layer is impaired and therefore, the amount of element added is preferably about $5 \times 10^{19}$ cm$^{-3}$ or less in terms of the atomic concentration. The buffer layer can also be composed of a high-resistance oxygen-containing boron phosphide-based semiconductor layer obtained by doping oxygen. In the presence of oxygen, a polycrystalline boron phosphide layer is readily formed (see, JP-A-2000-351692).

In order to obtain a boron phosphide-based buffer layer containing both an n-type or p-type impurity and oxygen, an alkoxyl compound containing an n-type or p-type impurity element can be suitably used. Examples of the alkoxyl compound of Si include tetramethoxysilane (Si(OCH$_3$)$_4$, boiling point: about +121° C.), tetraethoxysilane (Si(OC$_2$H$_5$)$_4$, melting point: about −77° C., boiling point: about +166° C.) and tetraisopropoxysilane (Si(i-OC$_3$H$_7$)$_4$, boiling point: about +226° C.). Examples of the alkoxyl compound of zinc (Zn) include dimethoxy zinc (Zn(OCH$_3$)$_2$). In these alkoxyl compounds, an element imparting electrical conductivity (in the above-described example, Si or Zn) and oxygen (O) electrically compensating the element to inactivate it are contained at a ratio of 1:1. Therefore, it is expected that a high-resistance oxygen-containing boron phosphide-based crystal layer can be readily obtained. However, the possibility of being incorporated into the crystal layer differs among the impurity elements in some cases, and a high-resistance layer is not always obtained due to a quantitative imbalance of the incorporated impurities. Accordingly, for example, in the case where an electrically conducting crystal layer is formed, an oxygen-containing mixed gas such as oxygen-hydrogen (H$_2$), oxygen-nitrogen (N$_2$) or oxygen-argon (Ar) may be used as another source of oxygen, in addition to the alkoxyl compound, to obtain a high-resistance layer.

The oxygen-containing boron phosphide-based semiconductor layer has high resistance and therefore, provides an effect of suppressing unnecessary leakage of the device operating current. Accordingly, in the sixth embodiment of the present invention, a transistor having excellent properties, for example, a hetero-junction bipolar transistor (HBT) or a field effect transistor (FET), is constructed by using such a high-resistance layer. For example, in a Schottky junction-type FET (MESFET) where the high-resistance boron phosphide-based semiconductor layer according to the present invention is jointed as a buffer layer just under an active layer, the leakage of a drain current to the buffer layer can be inhibited and therefore, the MESFET can have an excellent gate pinch-off property. In turn, an MESFET having excellent transconductance (gm) can be obtained. Furthermore, when a two-dimensional electron channel layer (channel layer) is provided on the high-resistance oxygen-containing boron phosphide-based semiconductor layer according to the present invention, a two-dimensional electron gas field effect transistor (TEGFET) capable of exerting a good gate pinch-off property and good transconductance can be obtained.

When the oxygen-containing boron phosphide-based semiconductor layer is provided on a buffer layer mainly comprising an amorphous or polycrystal formed on a single crystal substrate, a high-resistance oxygen-containing boron phosphide-based semiconductor layer capable of more effectively preventing the leakage of a device operating current can be formed. This is because, for example, a high-resistance oxygen-containing boron phosphide-based semiconductor layer reduced in misfit dislocation giving rise to short circuiting of operating current can be obtained by virtue of the amorphous buffer layer. Furthermore, when a channel layer is composed of a semiconductor material lattice-matching with a high-resistance oxygen-containing boron phosphide-based semiconductor having such good quality, a low-noise MESFET having a small noise-figure in addition to a good pinch-off property can be obtained because it exhibits high electron mobility. A suitable example of this lattice-matching stacked layer structure according to the seventh embodiment of this present invention is a construction where a channel layer comprising a cubic n-type gallium nitride phosphide ($GaN_{0.97}P_{0.03}$: lattice constant=4.538 Å) having a nitrogen composition ratio of 3% (=0.03) is joined on the high-resistance oxygen-containing boron phosphide-based layer (BP: lattice constant=4.538 Å). Another example is a construction where a channel layer comprising a cubic gallium nitride (c-GaN) is provided on the high-resistance oxygen-containing boron nitride phosphide ($BP_{0.97}N_{0.03}$) layer.

The high-resistance oxygen-containing boron phosphide-based semiconductor layer can not only be disposed just under a channel layer but also effectively used as a gate electrode-forming layer for forming a Schottky gate electrode. In the eighth embodiment of the present invention, a gate electrode is formed on the high-resistance oxygen-containing boron phosphide-based semiconductor layer, so that a gate electrode having reduced leakage current can be formed. Accordingly, a field effect-type transistor having a large transconductance and excellent pinch-off properties can be provided. In some cases, an MESFET is constructed by disposing both the source and drain electrodes together with the gate electrode on the high resistance oxygen-containing boron phosphide-based semiconductor layer and therefore, the layer thickness of the high-resistance oxygen-containing boron phosphide-based semiconductor layer is optimally set to such a thickness that an alloy front of the material constituting these two ohmic electrodes can sufficiently reach and penetrate into an active layer or in the case of a MESFET, into an electron supply layer. In general, the layer thickness of the high-resistance oxygen-containing boron phosphide-based semiconductor layer for forming a Schottky gate electrode is suitably about 100 nanometer (nm) or less. A Schottky gate electrode of MESFET for use in high frequency applications can be composed of a metal having a high melting point, such as titanium (Ti), platinum (Pt) or molybdenum (Mo), or a multilayer structure where layers of these metals are superposed.

Aside from use in the above electronic devices, in the ninth embodiment of the present invention, the high-resistance oxygen-containing boron phosphide-based semiconductor layer is applied to a light-emitting device. In a light-emitting device, the high-resistance oxygen-containing boron phosphide-based semiconductor layer is particularly useful as a current blocking layer for intentionally blocking the passing of a device operating current. For example, when the oxygen-containing boron phosphide-based semiconductor layer is used as a current blocking layer, a light-emitting diode (LED) capable of preferentially passing a device operating current to the light-emitting region opened to the outside can be constructed. When the high-resistance oxygen-containing boron phosphide-based semiconductor layer is disposed to exert so-called current-blocking action, a device operating current can be intensively passed to the open light-emitting region. Therefore, an efficient photoelectric transfer can be attained, so that an LED having a high light emission intensity can be provided.

If the maximum cross-sectional area in the horizontal cross section of a pad electrode (=$S_0$; the plane area in the projection region of the pad electrode on a layer where the pad electrode is deposited) is extremely different from the plane area (=S) where the current blocking layer is provided, this is disadvantageous in obtaining a light-emitting device having high light emission intensity. For example, if the plane area of the current blocking layer is excessively small compared to the plane area of the pad electrode (namely, $S/S_0 \ll 1$), the short circuit passing of the device operating current to the region just under the pad electrode cannot be satisfactorily prevented. As a result, the device operating current cannot be efficiently passed to the open light-emitting region and therefore, a light-emitting device having a sufficiently high light emission intensity cannot be obtained. On the other hand, if $S/S_0 \gg 1$, the majority of the open light-emitting region is occupied by the current blocking layer and a region capable of passing the device operating current is reduced. As a result, the light-emitting region area is reduced and this is disadvantageous in obtaining a light-emitting device having a high light emission intensity. In a light-emitting device, particularly LED, the ratio $S/S_0$ is suitably on the order of 0.7 to 1.2.

In the tenth embodiment of the present invention, the current blocking-type LED according to the present invention can be constructed by disposing the high-resistance oxygen-containing boron phosphide semiconductor layer just under a pad electrode for passing an operating current. More specifically, the oxygen-containing boron phosphide semiconductor layer is disposed on the surface of a clad layer constituting, for example, a single hetero (SH)- or double hetero (DH)-junction structure light-emitting part which corresponds to the projective region of the pad electrode. An electrically conducting layer is inserted between the pad electrode and the high-resistance oxygen-containing boron phosphide-based semiconductor layer to cover the surface of the open light-emitting region other than the projective region of the pad electrode. By disposing as such, an LED in which a device operating current supplied through the pad electrode can be inhibited from flowing to the region just under the pad electrode (a region disadvantageous for taking out the emitted light outside) due to the presence of the high-resistance oxygen-containing boron phosphide-based semiconductor layer, but which can be preferentially passed to the open light-emitting region, can be constructed.

The high-resistance oxygen-containing boron phosphide-based semiconductor layer can also be used as a current narrowing layer for use in a laser diode (LD). The eleventh embodiment of the present invention is described in detail below. The high-resistance oxygen-containing boron phosphide semiconductor layer serving as a current narrowing layer is first joined to the surface of a clad layer constituting, for example, a DH junction-type light-emitting part. Then, an open part is provided by linearly removing the center part of the current narrowing layer using, for example, wet or plasma etching means utilizing a selective patterning technique according to a known photolithography technique. As a result, current narrowing layers opposing each other through the band-like open part remain. Subsequently, an ohmic electrode is provided to contact with the surface of the clad layer or the like exposed in the open part of the current narrowing layer. The planar shape of an n-type or p-type ohmic electrode is generally made analogous to the planar shape of the open part. When the current narrowing layer is processed as such, since the current narrowing layer acts to block the passing of a current, the device operating current supplied from the ohmic electrode can be injected only to a specific region in contact with the electrode. The specific region, namely, the open part, has a small surface area as compared with the plane area of the light-emitting part and therefore, a high-density operating current can be intensively injected to the light-emitting part just under the open part. This is advantageous for obtaining laser light oscillation by induced emission.

In conventional techniques, the current narrowing layer for use in LD is constructed from a boron phosphide-based semiconductor having a conduction type opposite the underlying layer such as a clad layer (see, JP-A-10-242569, supra). For example, an n-type boron phosphide-based semiconductor layer is disposed for a p-type clad layer. However, conventional techniques have a problem in that in view of the effective mass of an electron, an n-type boron phosphide-based semiconductor layer suitable as a current narrowing layer cannot be easily obtained as compared with a p-type boron phosphide-based semiconductor layer. When the oxygen-containing boron phosphide-based semiconductor layer of the present invention having high resistance by incorporating oxygen is used, a current narrowing layer can be readily constructed even for the p-type underlying layer. In other words, the oxygen-containing boron phosphide-based semiconductor layer having high resistance by adding oxygen is advantageous in that a current narrowing layer for general purposes can be constructed irrespective of the conduction type of the layer on which the current narrowing layer is deposited.

Figure 4:
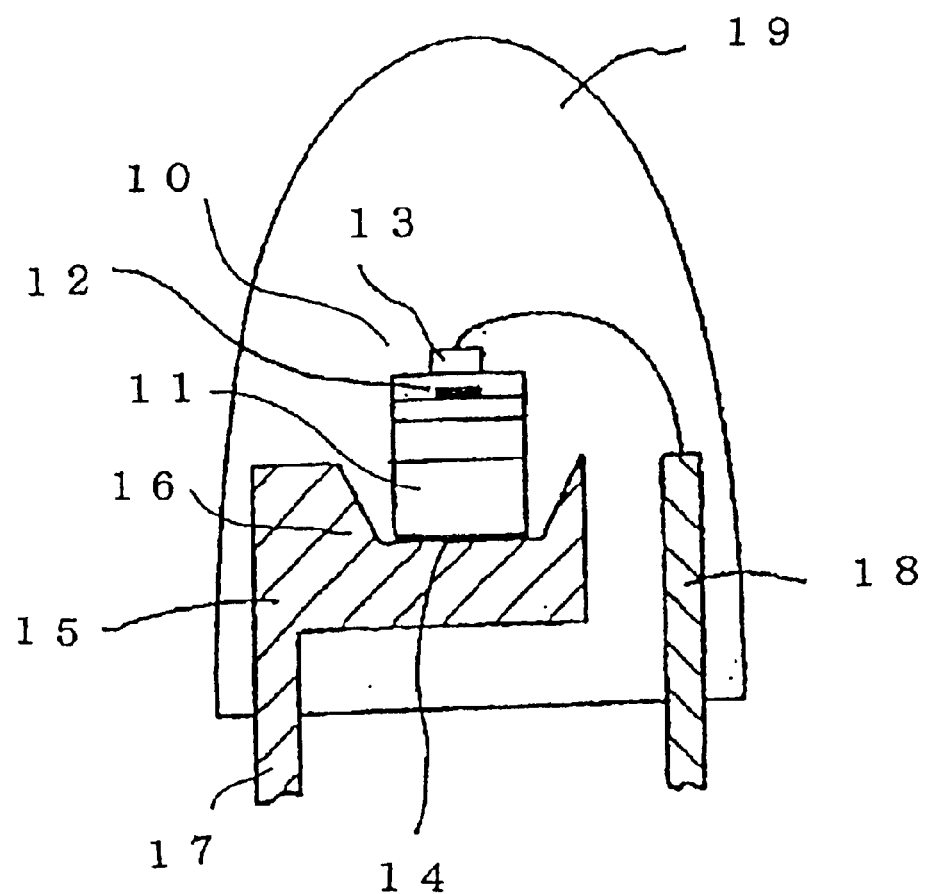
FIG. 4 is a schematic view showing a sectional structure of a lamp according to the present invention.

From the LED according to the present invention, a high-luminous light-emitting diode lamp can be constructed. For example, as shown in FIG. 4, an LED 10 comprising a substrate 11 having thereon the oxygen-containing boron phosphide-based semiconductor layer 12 according to the present invention is fixed to the center part of a metal-made cup 16 on a mount 15 using an electrically conducting adhesive material, where the center part of the cup 16 is plated with a metal such as silver (Ag) or aluminum (Au). As a result, one polar back surface electrode 14 provided on the bottom of the substrate 11 is electrically connected to one terminal 17 attached to the mount 15. Then, a surface electrode 13 disposed on the LED 10 is connected to another terminal 18 and thereafter, the entire structure is molded to surround the cup 16 with an epoxy resin 19 for the molding of general semiconductors, whereby a lamp can be constructed. According to the present invention, a small LED even in a size of about 200 to about 300 $\mu$m square can be formed and in turn, a small light-emitting diode lamp suitable as a display or the like installed in a small volume can be constructed.

When the LED lamps are assembled, a light source can be constructed. For example, a constant voltage driving-type light source can be constructed by electrically connecting a plurality of LED lamps in parallel, or a constant current-type light source can be constructed by electrically connecting LED lamps in series. Unlike conventional incandescent-type lamp light sources, the light source using this LED lamp does not emit such a large amount of heat radiation on lighting and therefore, can be particularly useful as a "cool" light source. For example, the light source can be used as a light source for displaying frozen food. Also, a light source suitable for use in, for example, an outdoor display, traffic signals, a direction indicator or lighting equipment can be constructed.

In the oxygen-containing boron phosphide-based semiconductor layer, the oxygen compensates a carrier within a semiconductor layer to electrically inactivate it to give a high-resistance boron phosphide-based semiconductor layer.

The oxygen-containing boron phosphide-based semiconductor layer having high resistance due to the electrical compensation activity of oxygen prevents unnecessary leakage of device operating current. Particularly, the oxygen-containing boron phosphide-based semiconductor layer having an oxygen atom concentration of $1 \times 10^{18}$ cm$^{-3}$ or more and a resistivity of $10^2$ $\Omega$·cm or more can be used as a buffer layer for a transistor, or a current blocking or narrowing layer of a light-emitting device.

An underlying amorphous or polycrystalline boron phosphide-based semiconductor layer gives rise to a continuous high-resistance boron phosphide-based semiconductor layer of good quality having excellent crystallinity, and also gives rise to an active layer having excellent crystallinity when disposed on the high-resistance oxygen-containing boron phosphide-based semiconductor layer.

EXAMPLES

The present invention will be described in further detail by referring to the following Examples, which should not be construed as limiting the present invention thereto.

Example 1

Figure 2:
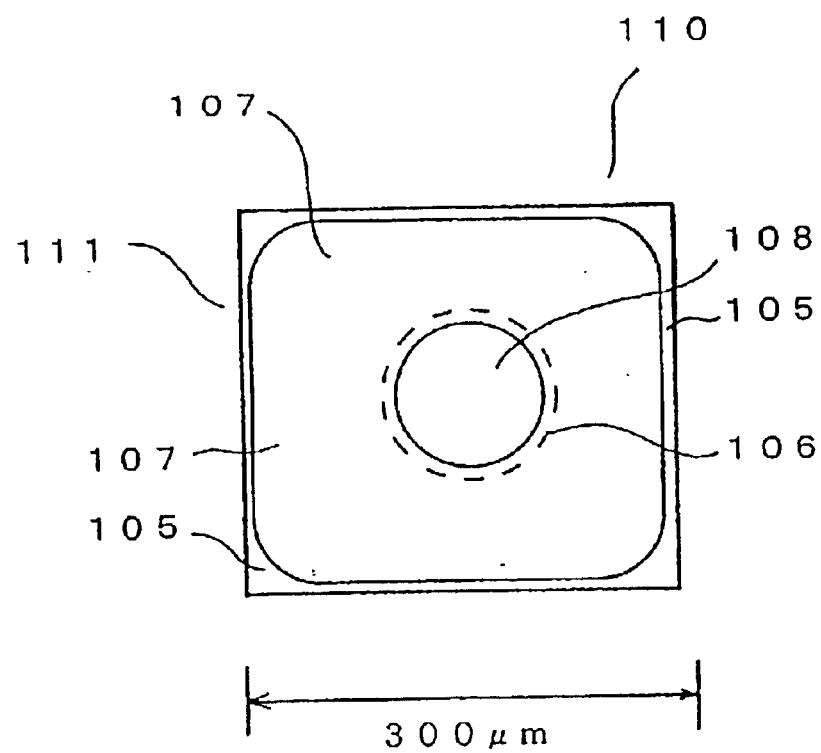
FIG. 2 is a schematic plan view of an LED according to Example 1 of the present invention.

In Example 1, the present invention is described in detail by referring to the case of manufacturing a light-emitting diode (LED) having a high-resistance oxygen-containing boron phosphide (BP)based semiconductor layer. FIG. 1 shows a schematic cross-sectional view of LED 110 according to Example 1 and FIG. 2 shows a schematic plan view of the LED 110.

A stacked layer structure 111 for use in the light-emitting device according to the present invention can be constructed using various crystal materials as a substrate 101. In this Example, a boron (B)doped p-type Si single crystal having a (111) face was used as the substrate 101. On the substrate 101, a low-temperature buffer layer 102 comprising boron phosphide grown at 350° C. was deposited by an atmospheric pressure MOCVD method employing a triethylborane $(C_2H_5)_3B$)/phosphine (PH$_3$)/hydrogen (H$_2$) system. The layer thickness of the low-temperature buffer layer 102 was about 5 nm.

On the surface of the low-temperature buffer layer 102, a magnesium (Mg)-doped p-type BP layer was stacked at 800° C. as a lower clad layer 103 using the above-described MOCVD vapor phase growth means. The magnesium doping source used was bis-cyclopentadienyl magnesium (bis-$(C_5H_4)_2Mg$). The carrier concentration of the p-type BP layer 103 constituting the lower clad layer was about $8 \times 10^{18}$ cm$^{-3}$. The layer thickness was 700 nm. Since the underlying layer was the low-temperature buffer layer 102, the p-type BP layer 103 was a continuous film having no cracks. On the p-type BP lower clad layer 103, a cubic n-type GaN$_{0.97}$P$_{0.03}$ layer (lattice constant=4.538 Å) lattice-matching with boron phosphide (BP, lattice constant=4.538 Å) was stacked as a light-emitting layer 104. Silicon (Si) was used as an n-type dopant and the carrier concentration was about $1 \times 10^{17}$ cm$^{-3}$. The layer thickness of the light-emitting layer 104 was about 180 nm. On the surface of the n-type GaN$_{0.97}$P$_{0.03}$ light-emitting layer 104, an upper clad layer 105 comprising an n-type BP layer was stacked by the above-described MOCVD vapor phase growth means. Silicon (Si) was used as an n-type dopant, the carrier concentration was about $8 \times 10^{16}$ cm$^{-3}$ and the layer thickness was 80 nm. From the p-type BP lower clad layer 103, the n-type GaN$_{0.97}$P$_{0.03}$ light-emitting layer 104 and the n-type BP upper clad layer 105, which were stacked at the same growth temperature of 800° C., a light-emitting part having a pn junction-type double hetero (DH) structure was formed.

On the n-type BP upper clad layer 105, an oxygen-containing boron phosphide (BP) layer partially remaining as a current blocking layer 106 was stacked by MOCVD vapor phase growth means having added thereto triethoxyborane (B(OC$_2$H$_5$)$_3$) as a starting material for oxygen doping. The amount of the triethoxyborane $(B(OC_2H_5)_3)$ added to the MOCVD reaction system was set to give an oxygen atom concentration of about $2\times10^{18}$ cm$^{-3}$ inside the current blocking layer 106. The resistivity at room temperature of the current blocking layer 106 was about $3\times10^3$ Ω·cm according to the normal Hall effect measuring method. The layer thickness of the current blocking layer 106 was about 70 nm.

Using a known photolithography technique, selective patterning was applied only to a specific region (region where a pad electrode 108 was later formed) of the current blocking layer 106. Subsequently, plasma etching using a methane (CH$_4$)/hydrogen/argon mixed gas was applied such that the current blocking layer 106 only in the projective region of a pad electrode corresponding to the portion beneath the region where a pad electrode 108 was later formed was allowed to remain. The plane shape of the remaining current blocking layer 106 was a circular form having a diameter of 130 μm, which was analogous to the bottom shape of the pad electrode 108. In the region other than the remaining current blocking layer 106, the surface of the upper clad layer 105 was exposed. Thereafter, the surfaces of the upper clad layer 105 and the remaining current blocking layer 106 were covered with an electrically conducting n-type indium.tin composite oxide film (ITO) 107 (window layer). The resistivity of the indium.tin composite oxide film 107 was about $6\times10^{-4}$ Ω·cm and the layer thickness thereof was about 500 nm.

A circular pad electrode 108 was disposed to contact the surface of the indium•tin composite oxide film 107 provided on the current blocking layer 106. The pad electrode 108 was composed of a vacuum evaporated film (contact layer) comprising gold (Au). The diameter of the pad electrode 108 was 120 μm. The pad electrode 108 was disposed such that the center thereof agreed with the circularly remaining current blocking layer 106. The ratio (=S/S$_0$) between the plane area (=S) of the current blocking layer and the plane area (=S$_0$) of the pad electrode was about 1.17. Almost throughout the entire back surface of the p-type Si single crystal substrate 101, a p-type ohmic electrode 109 was disposed, thereby completing the LED 110. The p-type ohmic electrode 109 was composed of a vacuum evaporated film comprising aluminum (Al). The Si single crystal substrate 101 was cut in the directions parallel and perpendicular to the [211] direction and the LED chip 110 thus obtained had a square planar shape having a one-side length of about 300 μm.

A forward operating current of 20 mA was passed between the pad electrode 108 and the p-type ohmic electrode 109 and at this time, the emission center wavelength of the LED 110 was about 410 nm. The luminance of the LED in a chip state, measured using a general integrating sphere was about 6 millicandela (mcd). Thus, an LED comprising a boron phosphide-based semiconductor and having high light emission intensity was obtained. The forward voltage (so-called V$_f$) determined from the I-V characteristics was about 3.8 V (forward current=20 mA). The reverse voltage was about 8 V (reverse current=10 μA). Thus, an LED having a high breakdown voltage was obtained.

Example 2

Figure 3:
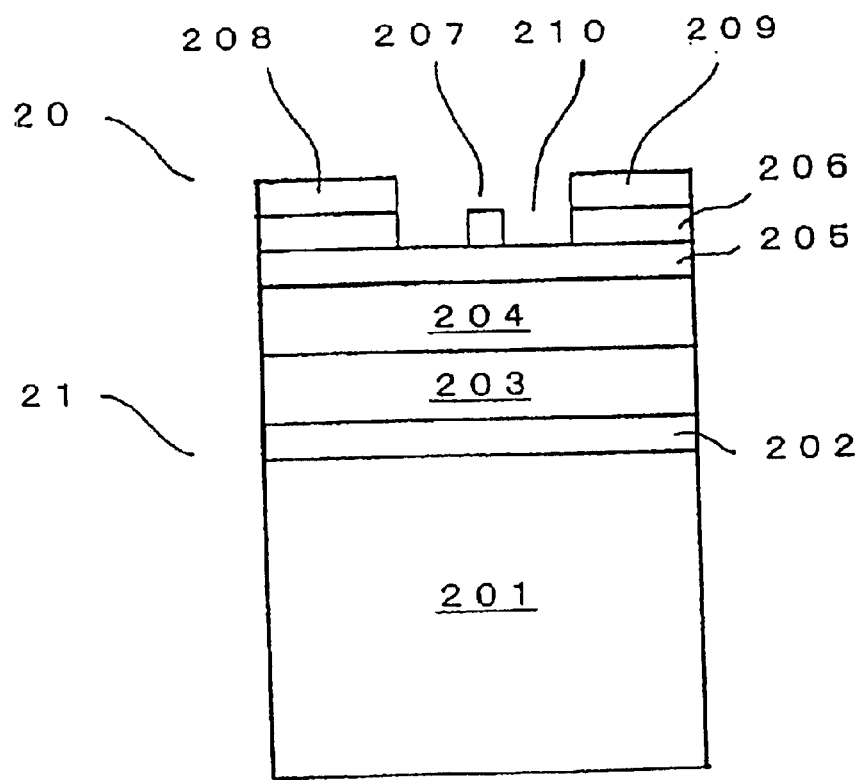
FIG. 3 is a schematic sectional view of a MESFET according to Example 2 of the present invention.

In Example 2, the present invention is described in detail by referring to the case of manufacturing a Schottky junction field effect transistor (MESFET) having a high-resistance oxygen-containing boron phosphide (BP)-based semiconductor layer as a buffer layer. FIG. 3 shows a schematic cross-sectional view of an MESFET 20 according to Example 2.

The stacked layer structure 21 for use in the MESFET 20 was constructed using sapphire (α-Al$_2$O$_3$ single crystal) as a substrate 201. On the substrate 201, a low-temperature buffer layer 202 comprising an undoped boron aluminum phosphide (B$_{0.95}$Al$_{0.05}$P) was deposited at 400° C. by an atmospheric pressure MOCVD method employing a (C$_2$H$_5$)$_3$B/trimethyl aluminum (CH$_3$)$_3$Al/PH$_3$/H$_2$ system. The layer thickness of the low-temperature buffer layer 202 was about 12 nm. This low-temperature buffer layer 202 was deposited at a low temperature of 400° C. and therefore, composed of an amorphous or polycrystalline phase.

On the surface of the low-temperature buffer layer 202, an oxygen-doped high-resistance BP layer was stacked at 800° C. as a buffer layer 203 by an atmospheric pressure MOCVD method employing a (C$_2$H$_5$)$_3$B/PH$_3$/H$_2$ system using a mixed gas mainly comprising H$_2$ and containing 20 vol. ppm of oxygen, as an oxygen source. The buffer layer 203 thus obtained was a continuous layer having no cracks. The oxygen atom concentration inside the buffer layer 203 was about $6\times10^{18}$ cm$^{-3}$. The resistivity of the buffer layer 203 at room temperature was about $1\times10^4$ Ω·cm. The layer thickness was about 500 nm. The band gap at room temperature of BP constituting the oxygen-containing high-resistance BP buffer layer 203 was determined from the wavelength dependency of the imaginary number part (=2·n·k, where n is refractive index and k is extinction coefficient) in the complex dielectric constant and found to be about 3.1 eV.

On the oxygen-containing high-resistance BP buffer layer 203, a silicon (Si)-doped n-type active layer 204 was stacked. The active layer 204 was composed of a cubic GaN$_{0.97}$P$_{0.03}$ lattice-matching with BP (lattice constant= 4.538 Å) constituting the oxygen-containing high-resistance BP buffer layer 203 as an underlying layer. The silicon doping source used was disilane (Si$_2$H$_6$) and the carrier concentration was about $1\times10^{17}$ cm$^{-3}$. Since the oxygen-containing high-resistance BP buffer layer 203 obtained as a continuous film by the effect of the low-temperature buffer layer 202 was an underlying layer and the active layer 204 was composed of a semiconductor material (cubic GaN$_{0.97}$P$_{0.03}$) lattice-matching with the underlying layer, a high electron mobility of about 1,000 cm$^2$/V·s was measured at room temperature by a normal Hall effect method. The layer thickness of the active layer 204 was 250 nm.

On the surface of the active layer 204, an oxygen-doped oxygen-containing high-resistance BP layer was stacked at 800° C. as a gate electrode-forming layer 205 for forming a Schottky gate electrode 207, by a normal pressure MOCVD method having a (C$_2$H$_5$)$_3$B/PH$_3$/H$_2$ system using a mixed gas mainly comprising H$_2$ and containing 20 vol. ppm of oxygen, as an oxygen source. The oxygen atom concentration inside the gate electrode-forming layer 205 was about $5\times10^{18}$ cm$^{-3}$. The resistivity of the gate electrode forming layer 205 was about $9\times10^3$ Ω·cm at room temperature and the layer thickness was about 50 nm.

On the surface of the gate electrode-forming layer 205, a silicon (Si)-doped n-type BP layer was stacked at 800° C. as a contact layer 206 for forming a source electrode 208 and a drain electrode 209, by a normal pressure MOCVD method having a (C$_2$H$_5$)$_3$B/PH$_3$/H$_2$ system. The carrier concentration of the contact layer 206 was about $2\times10^{18}$ cm$^{-3}$ and the layer thickness was about 50 nm.

By selective patterning means using a known photolithography technique and plasma etching means using a methane (CH$_4$)/hydrogen/argon mixed gas, a recess structure part 210 was formed as the region where a gate electrode 207 was later formed. The recess structure part 210 was formed by etching and removing the contact layer 206 in the region where a gate electrode 207 was later formed, and exposing the gate electrode-forming layer 205. On the surface of the gate electrode-forming layer 205 almost in the center of the recess structure part 210, a Schottky gate electrode 207 constructed from a titanium (Ti)/aluminum (Al) multilayer structure was disposed. The gate length was about 2 μm. On the remaining contact layers 206 opposing each other on both sides of the recess structure part 210, a source electrode 208 and a drain current 209 were disposed, respectively, thereby completing the MESFET 20.

A drain voltage of 15 volt (V) was applied between the source electrode 208 and the drain electrode 209 and at this time, the saturated drain current (Idss) was about 2.5 milliampere (mA). In Example 2, good pinch-off property was obtained by use of a high-resistance oxygen-containing boron phosphide (BP)-based layer as the buffer layer 203. The gate voltage was increased in a step of −2.5 V and the drain current property was measured. As a result, the gate pinch-off voltage was about −10 V. In Example 2, the Schottky gate electrode 207 was provided to contact with the gate electrode-forming layer 205 comprising a high-resistance oxygen-containing BP layer, therefore, the gate breakdown voltage was about 25 V or more at a gate leak current of 10 μA. Thus, a Schottky gate electrode 207 having high breakdown voltage was obtained. Furthermore, the transconductance (gm) was about 20 millisiemens (ms) and almost constant against the variation of negative voltage to the Schottky gate voltage. Thus, a boron phosphide-based MESFET having excellent static property (direct current (DC) property) was obtained.

EFFECT OF THE INVENTION

According to the present invention, a boron phosphide-based semiconductor layer rendered highly resistive by adding oxygen is used, for example, as a current blocking layer in constructing a light-emitting device (LED), so that an LED driving current can be preferentially passed only to the open light-emitting region. As a result, a high-density current can be effectively passed to the open light-emitting region and a boron phosphide-based semiconductor light-emitting device having high light emission intensity can be provided.

Furthermore, according to the present invention, a boron phosphide-based semiconductor layer rendered highly resistive by adding oxygen is used, for example, as a buffer layer disposed just under an active layer in constructing, for example, a field effect transistor (MESFET). As a result, the leakage of a drain current to the buffer layer can be inhibited, and a MESFET exhibiting a good pinch-off property and good transconductance property can be obtained.

Furthermore, according to the present invention, a boron phosphide-based semiconductor layer rendered highly resistive by adding oxygen is used, for example, as a gate electrode-forming layer for forming a Schottky gate electrode in constructing, for example, a field effect transistor (MESFET). As a result, the leakage of a drain current can be inhibited, and a MESFET having a high breakdown voltage Schottky gate electrode reduced in the gate leakage current can be obtained.

Furthermore, according to the present invention, an oxygen-containing boron phosphide-based semiconductor layer is stacked via an amorphous or polycrystalline buffer layer, so that a continuous oxygen-containing boron phosphide-based semiconductor layer free of cracks can be obtained. By using this as an underlying layer a semiconductor layer having excellent crystallinity can be formed as an active layer. As a result, a boron phosphide-based semiconductor light-emitting device having high light emission intensity or a field effect transistor having excellent transconductance (gm) property due to high electron mobility can be obtained.

While the invention has been described in detail and with reference to specific embodiments thereof, it will be apparent to one skilled in the art that various changes and modifications can be made therein without departing from the spirit and scope thereof.

What is claimed is:

1. A boron phosphide-based semiconductor device comprising a substrate having thereon an oxygen-containing boron phosphide-based semiconductor layer comprising boron and phosphorus as constituent elements and oxygen.

2. The boron phosphide-based semiconductor device according to claim 1, wherein the oxygen-containing boron phosphide-based semiconductor layer contains oxygen atoms in a concentration of from $1 \times 10^{18}$ to less than $5 \times 10^{20}$ cm$^{-3}$.

3. The boron phosphide-based semiconductor device according to claim 1, wherein the oxygen-containing boron phosphide-based semiconductor layer has a resistivity of $10^2$ Ω·cm or more.

4. The boron phosphide-based semiconductor device according to claim 1, further comprising an amorphous or polycrystalline boron phosphide-based semiconductor layer, and the oxygen-containing boron phosphide-based semiconductor layer is provided on the amorphous or polycrystalline boron phosphide-based semiconductor layer.

5. A transistor comprising an oxygen-containing boron phosphide-based semiconductor layer comprising boron and phosphorus as constituent elements and oxygen.

6. The transistor according to claim 5, wherein the oxygen-containing boron phosphide-based semiconductor layer contains oxygen atoms in a concentration of from $1 \times 10^{18}$ to less than $5 \times 10^{20}$ cm$^{-3}$.

7. The transistor according to claim 5, wherein the oxygen-containing boron phosphide-based semiconductor layer has a resistivity of $10^2$ Ω·cm or more.

8. The transistor according to claim 5, wherein the oxygen-containing boron phosphide-based semiconductor layer is provided on an amorphous or polycrystalline boron phosphide-based semiconductor layer.

9. The transistor according to claim 5, wherein the oxygen-containing boron phosphide-based semiconductor layer is a buffer layer.

10. The transistor according to claim 5, further comprising a channel layer provided on the oxygen-containing boron phosphide-based semiconductor layer.

11. The transistor according to claim 5, further comprising a Schottky gate electrode disposed on the oxygen-containing boron phosphide-based semiconductor layer.

12. A light-emitting device comprising a current blocking layer comprising an oxygen-containing boron phosphide-based semiconductor layer comprising boron and phosphorus as constituent elements and oxygen.

13. The light-emitting device according to claim 12, comprising an electrode provided on the current blocking layer.

14. A lamp comprising a light-emitting device comprising a current blocking layer comprising an oxygen-containing boron phosphide-based semiconductor layer comprising boron and phosphorus as constituent elements and oxygen.

15. A light source comprising a lamp comprising a light-emitting device comprising a current blocking layer comprising an oxygen-containing boron phosphide-base semiconductor layer comprising boron and phosphorus as constituent elements and oxygen.

16. The light-emitting device according to claim 12, said light-emitting device having a window layer for emitting light and further comprising an electrode disposed opposite a center portion of the current blocking layer, said electrode and current blocking layer occupying only a portion of the window layer of the light-emitting device.

17. A method for producing a boron phosphide-based semiconductor device comprising a substrate having thereon an oxygen-containing boron phosphide-based semiconductor layer comprising boron and phosphorus as constituent elements and oxygen, which comprises:

stacking a boron phosphide-based semiconductor layer on a substrate by metal organic chemical vapor deposition, and adding oxygen to the boron phosphide-based semiconductor layer using an oxygen-containing compound as a starting material to form an oxygen-containing boron phosphide-based semiconductor layer.

18. The method of producing the boron phosphide-based semiconductor device according to claim 17, wherein the oxygen-containing compound is an organic compound having an alkoxyl group —OR, wherein R represents a linear or branched, saturated or unsaturated alkyl group having from 1 to 12 carbon atoms, or an aromatic or alicyclic group having 6 to 20 carbon atoms bonded to oxygen.

19. The method of producing the boron phosphide-based semiconductor device according to claim 18, wherein the fundamental skeleton of the aromatic group is a benzene ring, a naphthalene ring, an anthracene ring or a phenanthrene ring, the aromatic group is substituted by CN, a halogen atom, OH, a carbonyl group, or a carboxyl group, and the alicyclic group is a cyclohexyl ring.

20. The method of producing the boron phosphide-based semiconductor device according to claim 17, wherein the oxygen-containing compound is a trialkoxyborane compound.

21. A method for producing a boron phosphide-based semiconductor device comprising a substrate having thereon an oxygen-containing boron phosphide-based semiconductor layer comprising boron and phosphorus as constituent elements and oxygen provided on an amorphous or polycrystalline boron phosphide-based semiconductor layer, which comprises:

forming on a substrate a boron phosphide-based semiconductor layer wherein a major part thereof is amorphous or polycrystalline at a temperature of 250 to 7000° C., and forming thereon an oxygen-containing boron phosphide-based semiconductor layer at a temperature of over 700 to 1,2000° C.

* * * * *